(12) United States Patent
Rao et al.

(10) Patent No.: US 9,863,624 B2
(45) Date of Patent: Jan. 9, 2018

(54) GAS-FILLED LED BULB MANUFACTURED BY SMT

(71) Applicant: Shenzhen Eastfield Lighting Co., Ltd., Shenzhen (CN)

(72) Inventors: Hanxin Rao, Shenzhen (CN); Guang Li, Shenzhen (CN)

(73) Assignee: Shenzhen Eastfield Lighting Co., Ltd., Shenzhen (CN)

( * ) Notice: Subject to any disclaimer, the term of this patent is extended or adjusted under 35 U.S.C. 154(b) by 199 days.

(21) Appl. No.: 14/885,123

(22) Filed: Oct. 16, 2015

(65) Prior Publication Data
US 2017/0038050 A1 Feb. 9, 2017

(30) Foreign Application Priority Data

Aug. 7, 2015 (CN) .......................... 2015 1 0483880

(51) Int. Cl.
*F21V 29/503* (2015.01)
*F21V 29/70* (2015.01)
*F21V 15/04* (2006.01)
*F21K 9/232* (2016.01)
*H05K 1/18* (2006.01)
*F21Y 101/00* (2016.01)
*F21Y 115/10* (2016.01)

(52) U.S. Cl.
CPC .............. *F21V 29/503* (2015.01); *F21K 9/232* (2016.08); *F21V 15/04* (2013.01); *F21V 29/70* (2015.01); *F21Y 2101/00* (2013.01); *F21Y 2115/10* (2016.08); *H05K 1/189* (2013.01); *H05K 2201/056* (2013.01); *H05K 2201/10106* (2013.01)

(58) Field of Classification Search
CPC ........ F21V 29/503; F21V 29/70; F21V 15/04; F21K 9/232; H05K 2201/10106; H05K 2201/056; H05K 1/189; F21Y 2115/10; F21Y 2101/00
See application file for complete search history.

(56) References Cited

U.S. PATENT DOCUMENTS

| 2013/0107514 | A1* | 5/2013 | McNabb | F21V 21/00 362/231 |
| 2014/0268740 | A1* | 9/2014 | Veres | H01L 33/54 362/235 |

* cited by examiner

*Primary Examiner* — David V Bruce
(74) *Attorney, Agent, or Firm* — HoustonHogle LLP

(57) ABSTRACT

A gas-filled LED bulb manufactured by SMT includes a shell, a lamp holder, a holder, and a filament assembly. The shell defines a chamber therein. The lamp holder is positioned outside the chamber and assembled to the shell. The holder is secured in the chamber and fixed to the shell. The filament assembly includes a plurality of LEDs packaged in a SMD or CSP and a bendable circuit board. The LED is mounted on the circuit board by SMT and arranged on the circuit board sequentially, the circuit board has an elongated shape, and opposite ends of the circuit board are fixed to the holder.

20 Claims, 15 Drawing Sheets

GAS-FILLED LED BULB MANUFACTURED BY SMT

RELATED APPLICATIONS

This application claims priority under 35 U.S.C. §119 to Chinese Patent Application No. 201510483880.7, filed Aug. 7, 2015. The entire teachings of the above application are incorporated herein by reference.

FIELD OF THE INVENTION

The present disclosure relates to the field of lamps, and more particularly relates to a gas-filled LED (Light Emitting Diode) bulb manufactured by SMT (Surface Mount Technology).

BACKGROUND OF THE INVENTION

A general LED bulb is provided with a metallic heat dissipating member. The LED is disposed on the metallic heat dissipating member to realize effective heat dissipation. However, such LED bulb is bulky, and it is difficult to realize a whole view angle luminance. In order to overcome the above described shortcomings, a structure that replaces the LED disposed on the metallic heat dissipating member by LED filament is adopted, allowing the LED bulb to be light and handy, and capable of radiating in a whole view angle.

However, the conventional LED filament is damaged easily, and a high power, such as 8 watts, cannot be reached. When power is high, the temperature of the LED filament is higher, thus a luminance decrease occurs easily.

SUMMARY OF THE INVENTION

Therefore, it is necessary to provide a gas-filled LED bulb to overcome the above shortcomings.

A gas-filled LED bulb manufactured by SMT includes a shell, a lamp holder, a holder, and a filament assembly. The shell defines a chamber therein. The lamp holder is positioned outside the chamber and assembled to the shell. The holder is secured in the chamber and fixed to the shell. The filament assembly includes a plurality of LEDs packaged in a Surface Mount Device (SMD) or Chip Scale Package (CSP) and a bendable circuit board. The LEDs are mounted on the circuit board by SMT and arranged on the circuit board sequentially, the circuit board has an elongated shape, and opposite ends of the circuit board are fixed to the holder.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

These and other features of the present invention will become readily apparent upon further review of the following specification and drawings. In the drawings, like reference numerals designate corresponding parts throughout the views. Moreover, components in the drawings are not necessarily drawn to scale, the emphasis instead being placed upon clearly illustrating the principles of the present disclosure.

DETAILED DESCRIPTION OF THE EMBODIMENTS

Figure 1:
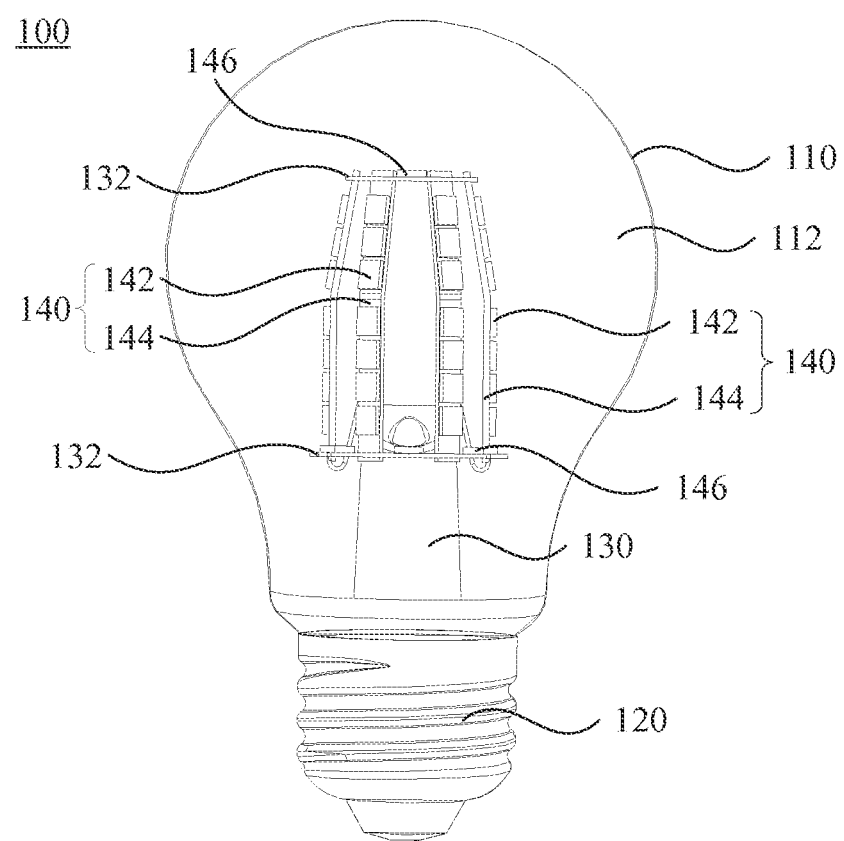
FIG. 1 is a front view of a gas-filled LED bulb manufactured by SMT according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
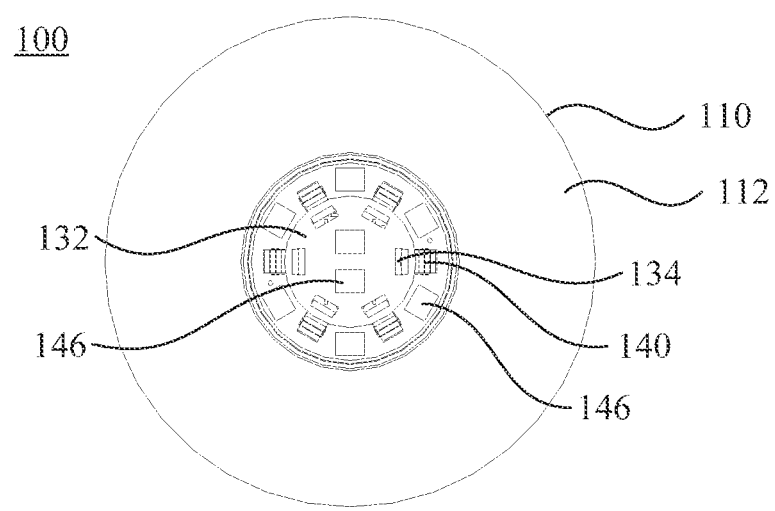
FIG. 2 is a top view of the gas-filled LED bulb manufactured by SMT of FIG. 1.

As shown in FIG. 1 and FIG. 2, a gas-filled LED bulb 100, by SMT according to an embodiment, includes a shell 110, a lamp holder 120, a holder 130, and a filament assembly 140. The shell 110 defines a chamber 112 therein. The lamp holder 120 is positioned outside the chamber 112 and assembled to the shell 110. The holder 130 is secured within the chamber 112. The holder 130 is disposed in the chamber 112 and secured to the shell 110. The filament assembly 140 includes a LED 142 packaged in a SMD or CSP and a bendable circuit board 144. The LED 142 is mounted on the circuit board 144 by SMT. SMT is an acronym of "Surface Mount Technology". SMD is an acronym of "Surface Mounted Devices". CSP is an acronym of "Chip Scale Package". The bendable circuit board 144 has an elongated shape, opposite ends of the circuit board 144 are fixed to the holder 130. The number of LEDs 142 can be more than two. The plurality of LEDs 142 are arranged on the circuit board 144 sequentially.

The LED 142 packaged in a SMD or CSP obtains a high reliability and a high shock resistance. The individually encapsulated LED 142 is mounted on the bendable circuit board 144 by SMT, thus the structure thereof is more reliable and can improve a yield rate. Because the circuit board 144 is in an elongated shape and can be bent, thus the circuit board 144 can be bent for shaping according to a requirement, thereby it is difficult to be damaged during the manufacturing process, reducing the processing difficulty and enhancing a qualified rate. In addition, bending the circuit board 144 for shaping can realize a uniform luminance. The LED 142 is mounted on the surface of the circuit board 144 by SMT, obtaining effective heat dissipation for the filament assembly 140 and realizing a high power. It is difficult for damage to occur and luminance decrease of the filament assembly 140 to occur.

In an embodiment, the gas-filled LED bulb 100 is filled with thermally conductive gas. The thermally conductive gas can provide an effective heat dissipation for the filament assembly 140 to extend a service life of the LED bulb 100. The thermally conductive gas can be hydrogen, helium, or neon. The thermally conductive gas can be a mixture of the above two or three gasses, and also can be a mixture of the above three gasses and other gasses.

In an embodiment, the holder 130 includes at least two fixing plates 132. An end of the filament assembly 140 is fixedly connected to one fixing plate 132 and the other end of the filament assembly 140 is fixedly connected to the other fixing plate 132. In an embodiment, the fixing plate 132 can define a plurality of connecting holes 134. An end of the filament assembly 140 is fixedly connected to the fixing plate 132 via the connecting hole 134. The above described connecting type can enhance a shock resistance of the filament assembly 140 of the LED bulb 100 and extends a service life of the LED bulb 100. In other embodiments, the filament assembly 140 can be connected to the fixing plate 132 via other connection types such as by adhesive or screws. The LED 146 is not only mounted on the circuit board 144, referring to FIG. 2 and FIG. 3, but also, the LED 146 can be mounted on the fixing plate 132 according to a requirement.

In an embodiment, a ratio between a width of the circuit board 144 and a width of the LED 142 is 1-1.2, i.e. a width of the circuit board 144 is equal to a width of the LED 142 or a width of the circuit board 144 is slightly greater than a width of the LED 142 such that the material of the circuit board 144 is saved, reducing the manufacturing cost of the LED bulb 100. In an embodiment, the plurality of LEDs 142 are closely arranged or spaced from each other. When the plurality of LEDs 142 are closely arranged, an area of the circuit board 144 occupied by the LEDs 142 can be saved, enhancing a luminance efficiency.

Figure 3:
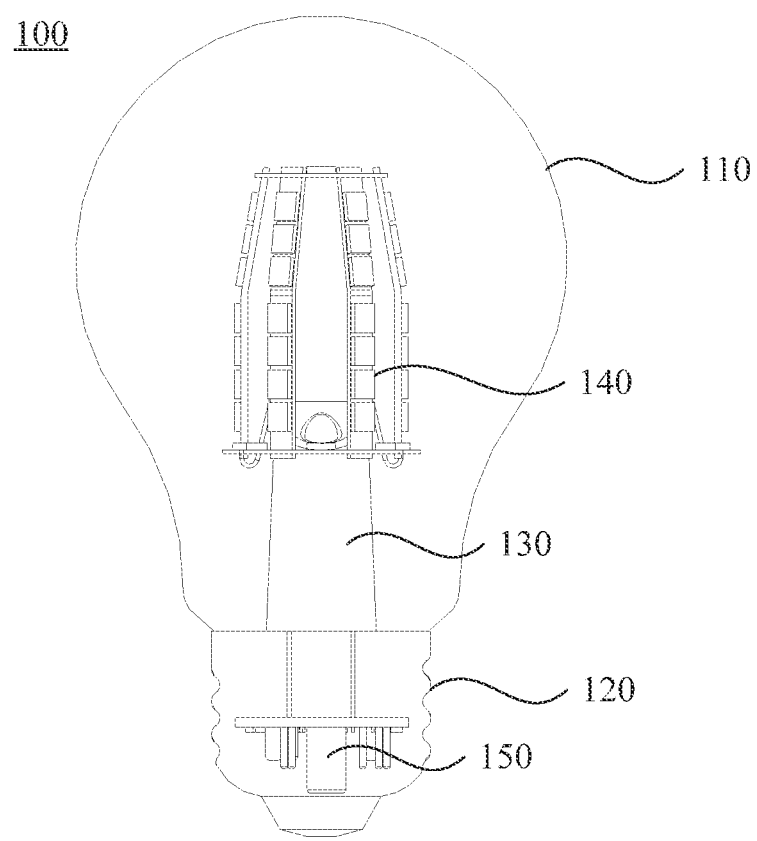
FIG. 3 is a cross-sectional view of the gas-filled LED bulb manufactured by SMT of FIG. 1.

Also, referring to FIG. 3, in an embodiment the gas-filled LED bulb 100 by SMT further includes a power source 150. The power source 150 is positioned in the lamp holder 120. The power source 150 is electrically connected to the plurality of circuit boards 144. The power source 150 is electrically connected to an external power source. In the embodiment, an external sidewall of the lamp holder 120 can be provided with threads. A connecting socket which is connected to the LED bulb 100 is provided with a thread coupling. The lamp holder 120 is connected to the connecting socket via connecting with the thread coupling.

Figure 4:
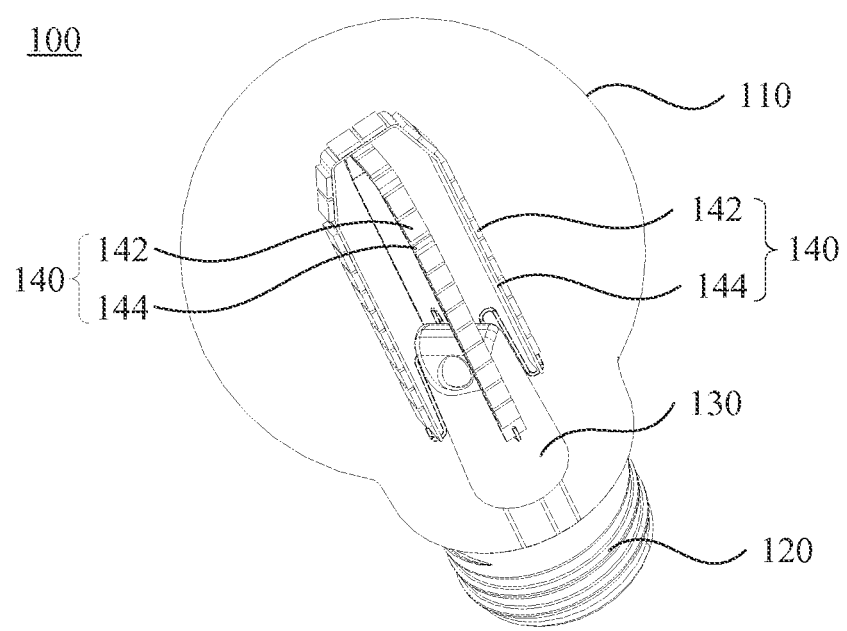
FIG. 4 is a front view of a gas-filled LED bulb manufactured by SMT according to another embodiment.
Figure 5:
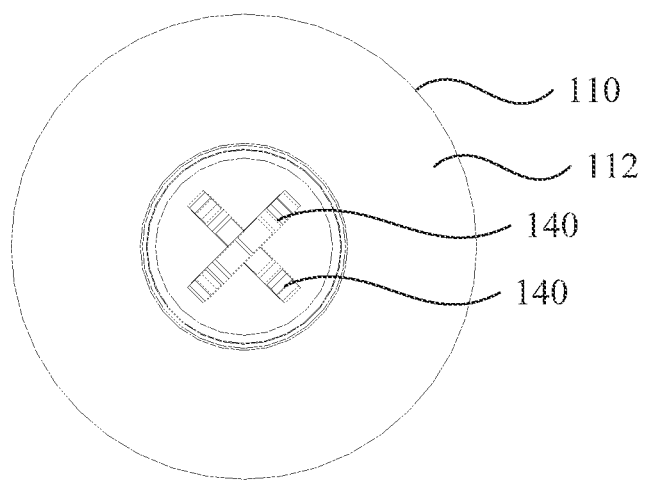
FIG. 5 is a top view of the gas-filled LED bulb manufactured by SMT of FIG. 4.
Figure 6:
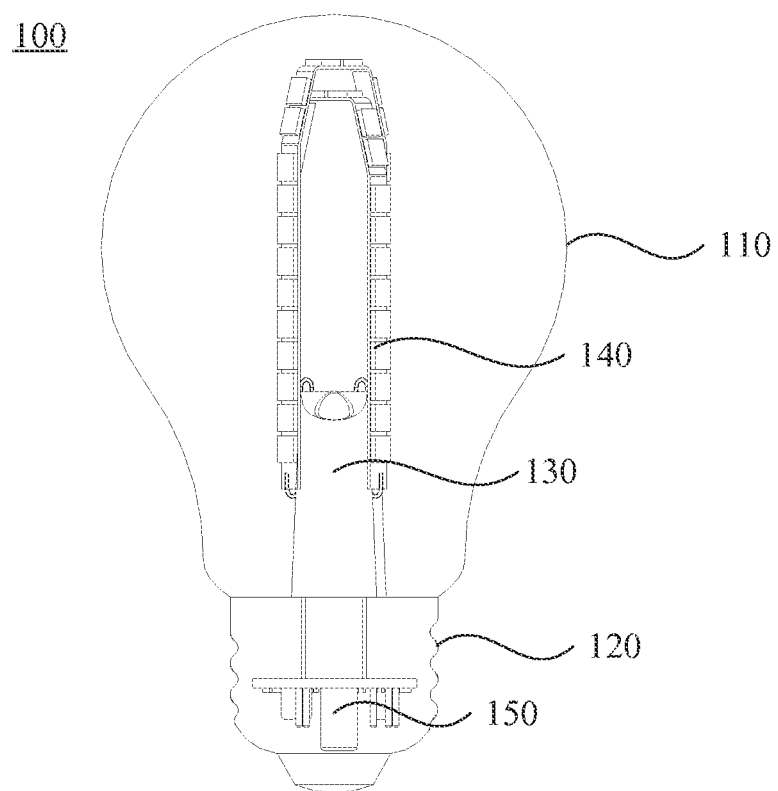
FIG. 6 is a cross-sectional view of the gas-filled LED bulb manufactured by SMT of FIG. 4.

Referring to FIG. 4 and FIG. 6, in another embodiment the number of the circuit boards 144 is more than two. Each circuit board 144 is bent to form a "U" shape. The plurality of circuit boards 144 intercross with each other and form gaps between each other which benefit heat dissipation. Because the plurality of circuit boards 144 intercross with each other, it allows the LED 142 to be distributed uniformly and attain a uniformity of luminance. The circuit board 144 has a structure which can be finalized after being shaped. Opposite ends of the U shaped circuit board 144 are fixedly connected to the holder 130. The holder 130 has a simple structure, and it is easy to be processed.

In another embodiment, the holder 130 can also be cylindrical. The filament assembly 140 helically surrounds the holder 130 (not shown). The filament assembly 140 is adjusted to helically surround the holder 130, thus saving space occupied by the filament assembly 140 and allowing the light emitted from the LED bulb 100 to luminance much more uniformly.

Figure 7:
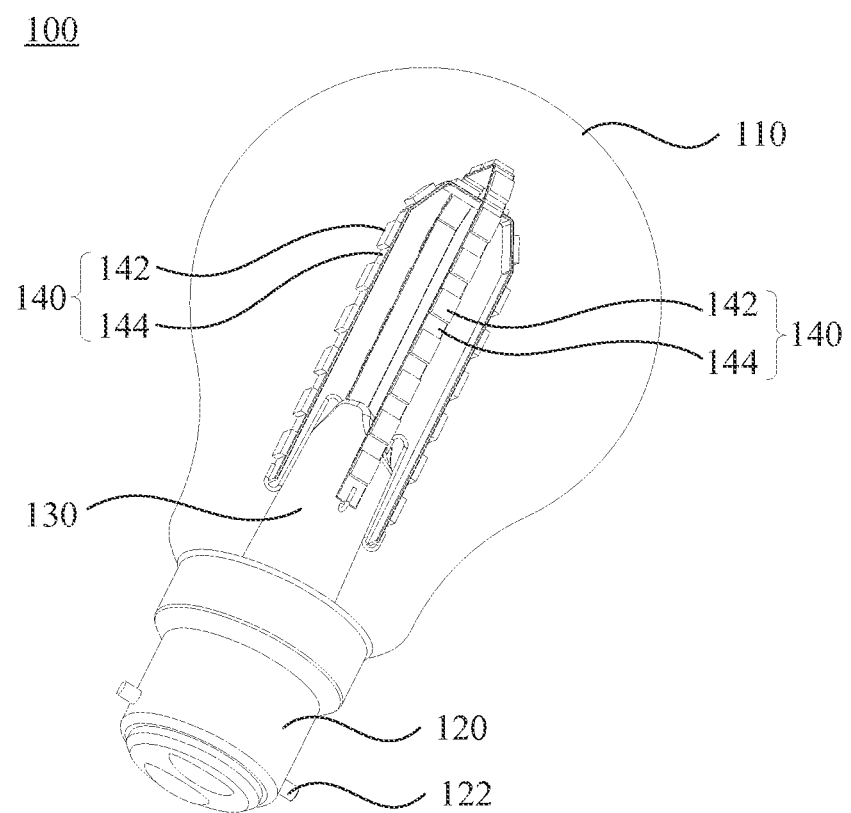
FIG. 7 is a schematic view of a gas-filled LED bulb manufactured by SMT according to another embodiment.
Figure 8:
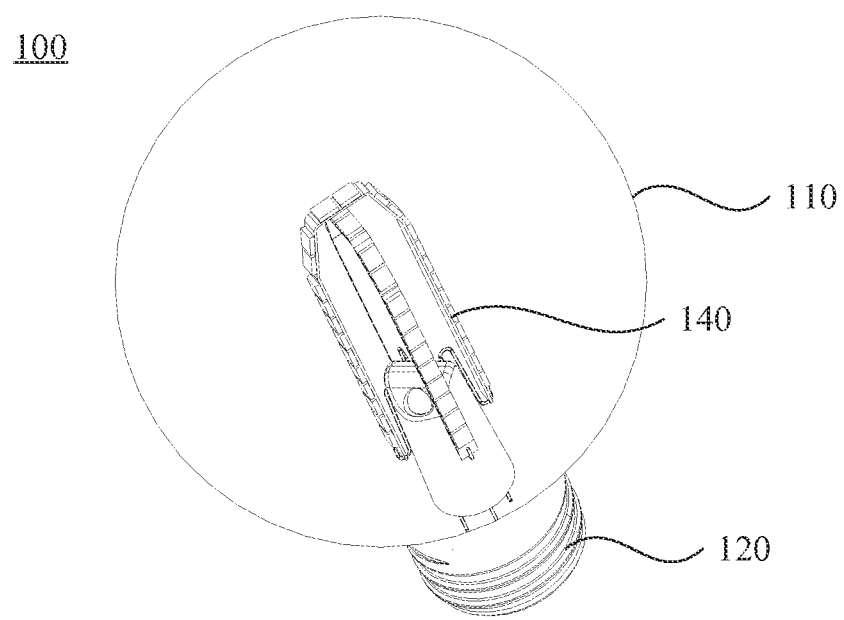
FIG. 8 is a perspective view of a gas-filled LED bulb manufactured by SMT according to another embodiment.
Figure 9:
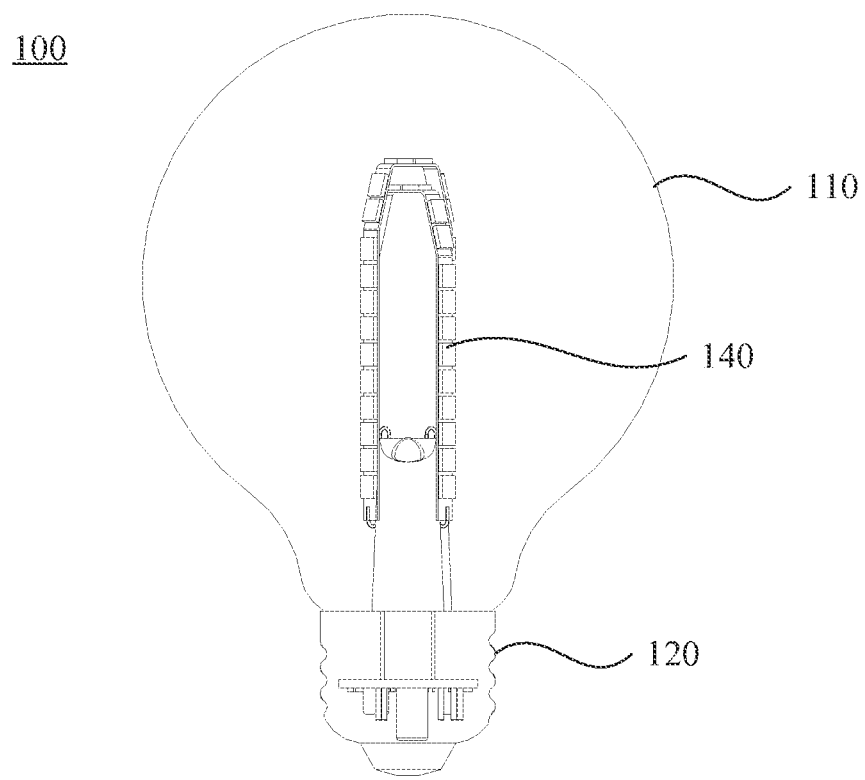
FIG. 9 is a cross-sectional view of the gas-filled LED bulb manufactured by SMT of FIG. 8.
Figure 10:
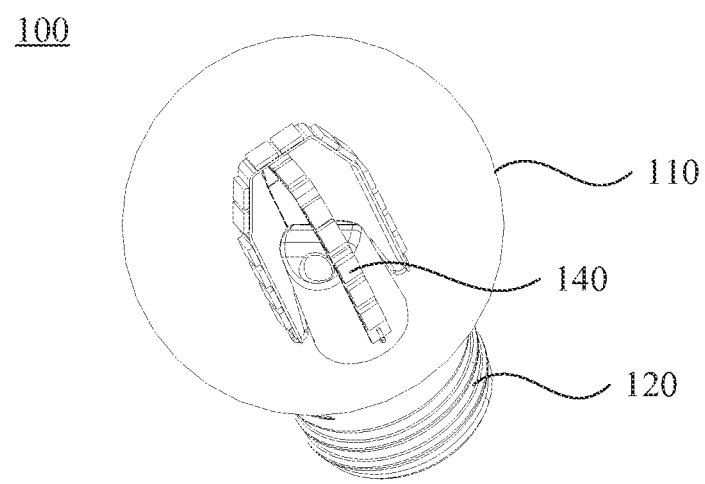
FIG. 10 is a perspective view of a gas-filled LED bulb manufactured by SMT according to another embodiment.
Figure 11:
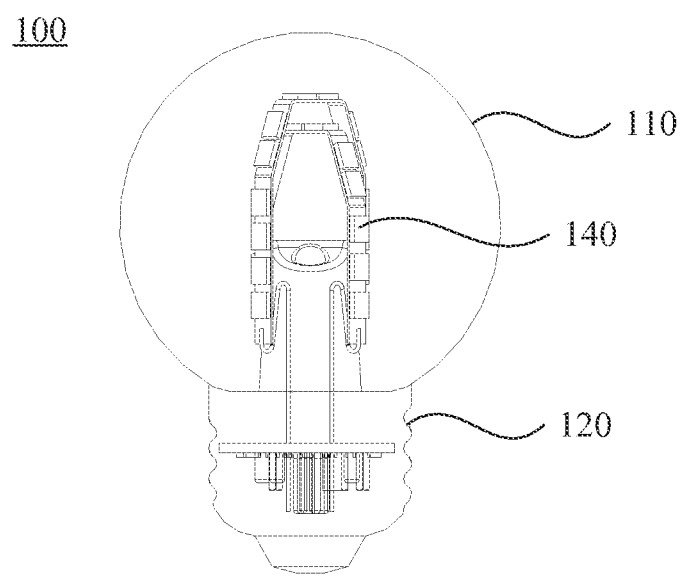
FIG. 11 is a cross-sectional view of the gas-filled LED bulb manufactured by SMT of FIG. 8.
Figure 12:
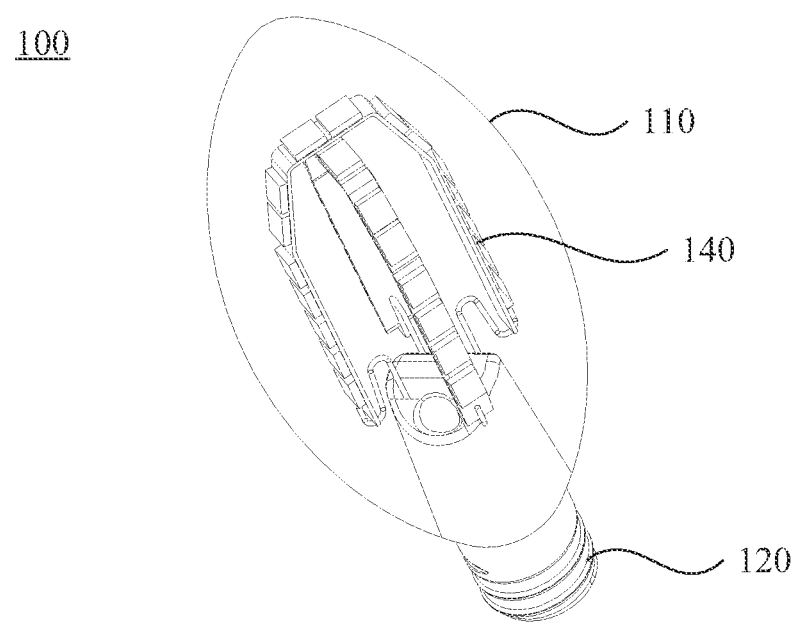
FIG. 12 is a perspective view of a gas-filled LED bulb manufactured by SMT according to another embodiment.
Figure 13:
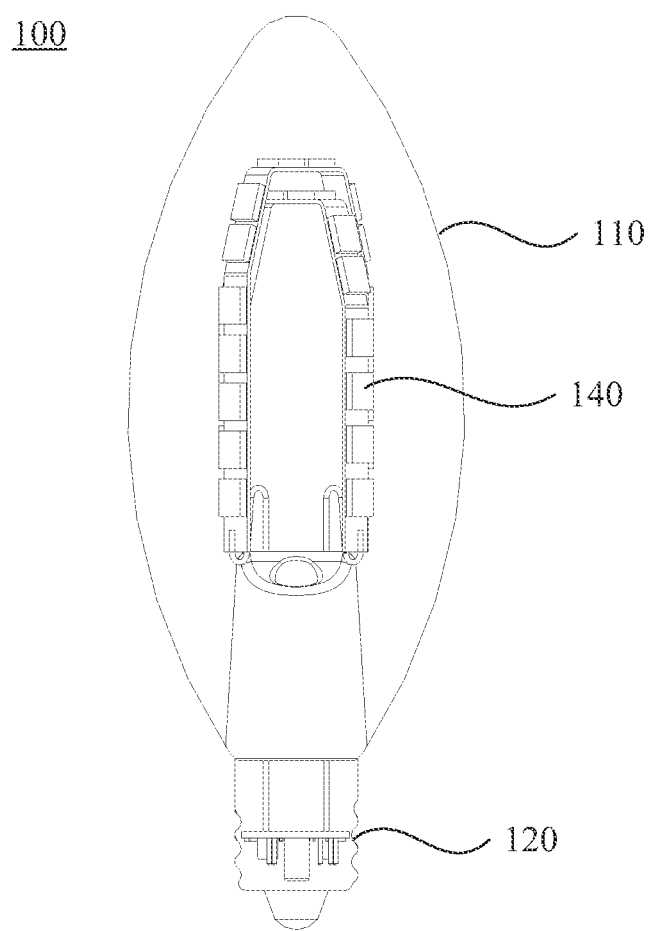
FIG. 13 is a cross-sectional view of the gas-filled LED bulb manufactured by SMT of FIG. 12.
Figure 14:
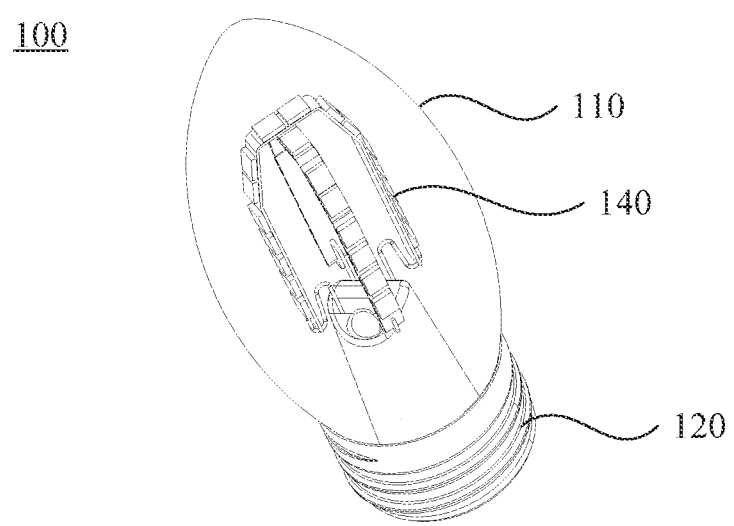
FIG. 14 is a perspective view of a gas-filled LED bulb manufactured by SMT according to another embodiment.
Figure 15:
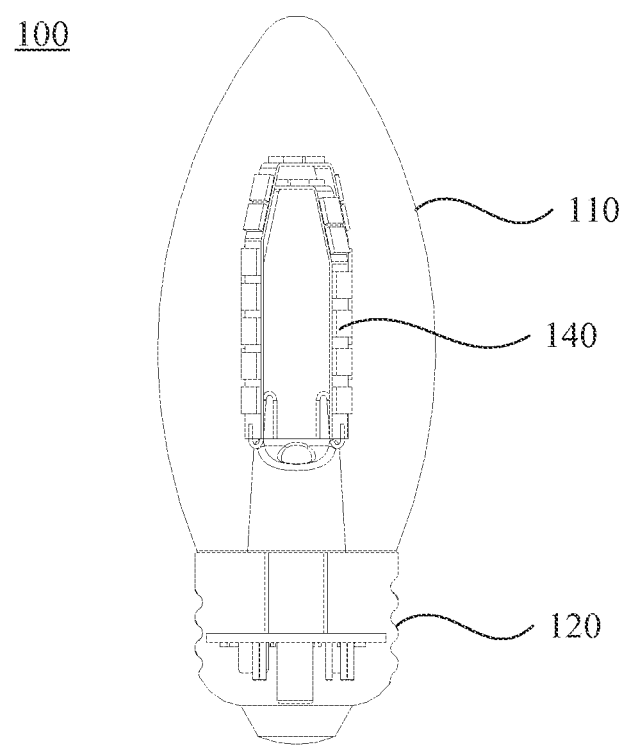
FIG. 15 is a cross-sectional view of the gas-filled LED bulb manufactured by SMT of FIG. 14.

It should be noted that the connecting type between the lamp holder 120 and the connecting socket of the LED bulb 100 is not limited to connect with the thread coupling, and can also adopt a connection of a latching coupling or other types of standard interfaces. As shown in FIG. 7, for example, the external sidewall of the lamp holder 120 is provided with two bayonet locks 122 which are configured to connect with a bayonet of the connecting socket.

The shell 110 can be designed to any shape. Referring to FIGS. 8 through 15, the shape and size of the lamp holders 120 throughout the figures are the same, and all lamp holders 120 have a standard shape and size. The shell 110 can be designed flexibly according to a requirement. In the embodiment shown in FIG. 8 and FIG. 9, the shell 110 can be substantially spherical with a large volume. In the embodiment shown in FIG. 10 and FIG. 11, the shell 110 can be substantially spherical with a small volume. The shape and size of the filament assembly 140 can be adjusted according to a requirement. In the embodiment shown in FIG. 12 and FIG. 13, the shell 110 can substantially have a candle shape with a large volume. In the embodiment shown in FIG. 14 and FIG. 15, the shell 110 can substantially have a candle shape with a small volume. The shape and size of the filament assembly 140 can be adjusted according to a requirement.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:
1. A gas-filled Light Emitting Diode (LED) bulb manufactured by Surface Mount Technology (SMT), comprising:
   a shell defining a chamber therein, wherein the shell is filled with thermally conductive gas, and wherein the thermally conductive gas is Hydrogen, Helium, or Neon;
   a lamp holder positioned outside the chamber and assembled to the shell;
   a holder secured in the chamber and fixed to the shell; and
   a filament assembly comprising a plurality of LEDs packaged by a Surface Mount Device (SMD) or a Chip Scale Package (CSP), and a bendable circuit board, wherein the plurality of LEDs are mounted on the circuit board by SMT and arranged on the circuit board sequentially, wherein the circuit board has an elongated shape, and wherein opposite ends of the circuit board are fixed to the holder.

2. The gas-filled LED bulb according to claim 1, wherein the holder comprises at least two fixing plates, an end of the filament assembly is fixedly connected to one fixing plate and the other end of the filament assembly is fixedly connected to the other fixing plate.

3. The gas-filled LED bulb according to claim 2, wherein each fixing plate defines a plurality of connecting holes, an end of the filament assembly is fixedly connected to the fixing plate via the connecting holes.

4. The gas-filled LED bulb according to claim 1, wherein there are two or more circuit boards.

5. The gas-filled LED bulb according to claim 4, wherein each circuit board is bent to form a "U" shape.

6. The gas-filled LED bulb according to claim 5, wherein there are a plurality of circuit boards that intercross with each other and form gaps between each other.

7. The gas-filled LED bulb according to claim 1, wherein the holder is cylindrical.

8. The gas-filled LED bulb according to claim 7, wherein the filament assembly helically surrounds the holder.

9. The gas-filled bulb according to claim 1, wherein a ratio between a width of the circuit board and a width of the LED is between about 1 to about 1.2.

10. The gas-filled LED bulb according to claim 1, wherein the plurality of LEDs are closely arranged or spaced from each other.

11. The gas-filled LED bulb according to claim 1, further comprising a power source, wherein the power source is disposed in the lamp holder and the power source is electrically connected to the circuit board.

12. The gas-filled LED bulb according to claim 1, wherein the plurality of LEDs comprise two or more LEDs.

13. The gas-filled LED bulb according to claim 1, wherein the circuit board has a width equal to a width of each of the LEDs.

14. The gas-filled LED bulb according to claim 1, wherein the circuit board has a width slightly greater than a width of each of the LEDs.

15. The gas-filled LED bulb according to claim 1, wherein the lamp holder has an external sidewall provided with two bayonet locks configured to connect with a bayonet of a connecting socket.

16. The gas-filled LED bulb according to claim 1, wherein the lamp holder has an external sidewall provided with threads configured to connect with a thread coupling of a connecting socket.

17. The gas-filled LED bulb according to claim 1, wherein the shell is substantially spherical or has a candle shape.

18. A gas-filled Light Emitting Diode (LED) bulb manufactured by Surface Mount Technology (SMT), comprising:
a shell defining a chamber therein;
a lamp holder positioned outside the chamber and assembled to the shell;
a holder secured in the chamber and fixed to the shell; and
a filament assembly comprising a plurality of LEDs packaged by a Surface Mount Device (SMD) or a Chip Scale Package (CSP), and two or more bendable circuit boards, wherein the plurality of LEDs are mounted on the circuit boards by SMT and arranged on the circuit boards sequentially, the circuit boards each have an elongated shape, and opposite ends of the circuit boards are fixed to the holder.

19. The gas-filled LED bulb according to claim 18, wherein each circuit board is bent to form a "U" shape.

20. The gas-filled LED bulb according to claim 19, wherein there are a plurality of circuit boards that intercross with each other and form gaps between each other.

* * * * *